United States Patent
Mroch

(10) Patent No.: US 7,579,916 B1
(45) Date of Patent: Aug. 25, 2009

(54) LOW NOISE FREQUENCY SYNTHESIZER

(75) Inventor: Alan B. Mroch, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 96 days.

(21) Appl. No.: 11/810,048

(22) Filed: Jun. 4, 2007

(51) Int. Cl.
*H03L 7/00* (2006.01)

(52) U.S. Cl. ............................... 331/2; 331/16; 331/25

(58) Field of Classification Search ............ 331/2, 331/16, 25, 46
See application file for complete search history.

(56) References Cited

U.S. PATENT DOCUMENTS 3,588,732 A * 6/1971 Tollefson .................. 331/2
4,839,603 A * 6/1989 Mower et al. ............. 327/105
4,912,432 A * 3/1990 Galani et al. .............. 331/2

* cited by examiner

*Primary Examiner*—Anh Q Tran
(74) *Attorney, Agent, or Firm*—Daniel M. Barbieri

(57) ABSTRACT

A frequency synthesizer comprising an input large step frequency source suitable for generating a large step frequency, a variable frequency source suitable for generating a small step frequency, a first phase detector, a first voltage controlled oscillator, a first mixer, a second phase detector, a second voltage controlled oscillator, a second mixer, at least two frequency divide circuits and a feedback loop is disclosed. The input large step frequency source and the variable frequency source are suitable for combining to form mixed frequency, second voltage controlled oscillator is in the feedback loop and the feedback loop is suitable for receiving the combination of the large step frequency and the variable frequency.

20 Claims, 5 Drawing Sheets

LOW NOISE FREQUENCY SYNTHESIZER

FIELD OF THE INVENTION

This invention relates to radio communications systems, frequency synthesizers, and specifically improving spurious performance and reducing phase noise in a phase locked loop that may be used in a frequency synthesizer.

BACKGROUND OF THE INVENTION

Modern high frequency communication systems such as transceivers or equipments for testing such systems often include frequency converter or synthesizer circuits which can perform a variety of functions. For instance, such circuitry is utilized in transceivers or test equipment to provide a selected local oscillator signal when such equipment is operated in a "receive mode" or to provide an output signal having a selected stable reference frequency for converting the frequencies of a modulated signal when such equipment is operated in a "transmit mode" or as a signal generator. Further, frequency synthesizer systems are required in signal generators in order to adequately test high performance RF systems and components.

A frequency synthesizer is an apparatus which generates an output signal having a frequency which is a multiple of a reference frequency. The accuracy of the output signal frequency is typically determined by the accuracy and stability of the reference frequency source. A common type of frequency synthesizer uses a phase-locked loop (PLL) to provide an output signal having a selectable, precise and stable frequency. A PLL typically includes a phase detector, a voltage-controlled oscillator (VCO) and, a feedback path arranged so that the phase of the VCO output is forced to be synchronous with the phase of the input reference frequency.

The complexity of PLLs can give rise to more complex phase noise profiles, can compromise frequency settling time, or generate spurious signals. Phase noise may be defined as is rapid, short-term, random fluctuations in the phase of a wave, caused by time domain instabilities. Spurious signals are any outputs in the spectrum of a source that are neither part of the carrier, nor its harmonic and they may be discreet or bands of frequencies. Such noise and spurious signals are problematic for synthesizers. In the frequency domain, an ideal carrier would appear as an infinitesimally thin line, the typical carrier however, will have phase noise or skirts whose amplitudes generally follow 1/f distribution with increasing frequencies. These skirts are the envelope of side bands due to modulations of the carrier, are random in both frequency and amplitude, and are caused by various phenomena relating to the physics of the particular oscillator. Spurious signals are equally problematic for frequency synthesizers. For instance, spurious signals with amplitude 10% of true phase calibration signal may introduce errors in determination of group delays up to 50 psec. Unfortunately, cases of such strong spurious signals are quite prevalent in frequency synthesizers.

Frequently, performance compromises must be made in the design of synthesizers, resulting in less than optimum performance of one or more frequency synthesizer characteristics. For instance, current frequency synthesizer noise reduction techniques are directed toward single frequency noise reduction, lack coherent spurious signals, or do not exploit the coherent spurious nature of the frequency synthesizer architecture if present. Disadvantageously, this creates a shortcoming in frequency synthesizers. For instance, in order to provide a frequency synthesizer having a small step size between adjacent output frequencies, a very low reference frequency is required. Using a very low reference frequency, however, limits the frequency range and extends the time required for the PLL to settle (or lock) once a new frequency has been selected.

Referring to FIG. 1, a prior art synthesizer 100 is shown. Synthesizer includes at least one phase locked loop which includes an input reference frequency 102, a modulated fractional divider (MFD) 104, a phase detector 106, a voltage controlled oscillator (VCO) 108, a mixer 110 and a divider 112. The phase detector 106 typically has an output coupled through a loop filter to control the frequency of the VCO 108. The output of the VCO 108 is fed back through a circuit, such as a divide by N circuit 112, to a first input of the phase detector 106. The frequency of the VCO 108 output signal is changed in steps by changing "N" of the divide-by-N circuit 112 in a known manner. At phase-lock, a synthesized output frequency 114 is proportional to the input frequency 102. A constant reference frequency signal is applied to a second input of the phase detector 106 by a crystal oscillator, for instance. A modulated fractional divider is utilized to provide fine frequency steps. However, this prior art circuitry is capable of providing non-coherent spurious signals on the modulated fractional divider.

Referring to FIG. 2, an additional prior art synthesizer is shown. Synthesizer 200 includes a single frequency source as an input reference frequency, a first divider 204, a phase detector 206, a VCO 208, a mixer 210 and a second divider 212. By utilizing a divider circuit 212 in the VCO feedback path and selectably controlling the division ratio, a variable frequency can be provided at the output of the frequency synthesizer. In this manner, the VCO output frequency 214 is divided by the selectable divisor, and the VCO output frequency is an exact multiple of the reference frequency. If the divisor N is an integer, the smallest increment in the VCO output frequency value is necessarily equal to the magnitude of the reference frequency itself. This technique provides coherent spurious content, however, it is only useful for single frequency applications.

Consequently, it would be advantageous if a method and system existed which provided an improved frequency synthesizer that reduces phase noise and spurious signals for multiple frequencies.

SUMMARY OF THE INVENTION

Accordingly, the various embodiments of the present invention are directed to an improved low noise synthesizer system and method.

According to an aspect of an embodiment of the present invention, an improved low noise synthesizer system is disclosed. System may comprise an input reference frequency generated via a large step frequency source, a variable frequency source and a first phase detector. Variable frequency source may be a small step variable frequency source. Small step variable frequency source comprises a range of frequencies at least equivalent to a large step frequency source range. System may comprise also a first voltage controlled oscillator (VCO), and a first mixer. System may further comprise a second phase detector, a second mixer operably coupled to one input of the second phase detector, a second VCO suitable for receiving an output of the second phase detector and at least two frequency dividers. Second VCO may be in a feedback loop of the PLL. The feedback loop may be suitable for receiving the difference mix of the small step variable frequency and the large step frequency. The system is suitable for providing effective reduction of noise in the PLL, and producing coherent spurious content in the large step loop.

According to an additional aspect of an embodiment of the present invention, a method for synthesizing frequencies is disclosed. Method comprises providing an input reference frequency from a large step frequency source, a variable frequency source and a first phase detector. Variable frequency source may be a small step variable frequency source. Small step variable frequency source is suitable for producing frequencies at least equivalent to a large step frequency source range of the input frequency. Method may further comprise providing a first voltage controlled oscillator (VCO), and a first mixer forming a phase locked loop. Method may generate a first frequency in the phase locked loop. Method may also comprise providing a second phase detector, a second mixer operably coupled to one input of the second phase detector, a second VCO suitable for receiving an output of the second phase detector and at least two frequency divide circuits. Method may provide the second VCO in the feedback loop. Method may provide a difference mix of the large step frequency and the small step frequency and receiving the difference mix in the feedback loop. The method is enabled to provide a frequency synthesizer having a wide frequency range suitable for providing effective reduction of noise in the PLL, and producing coherent spurious content in the loop containing the large step frequency source.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to presently preferred embodiments of the invention, examples of which are illustrated in the accompanying drawings.

Figure 1:
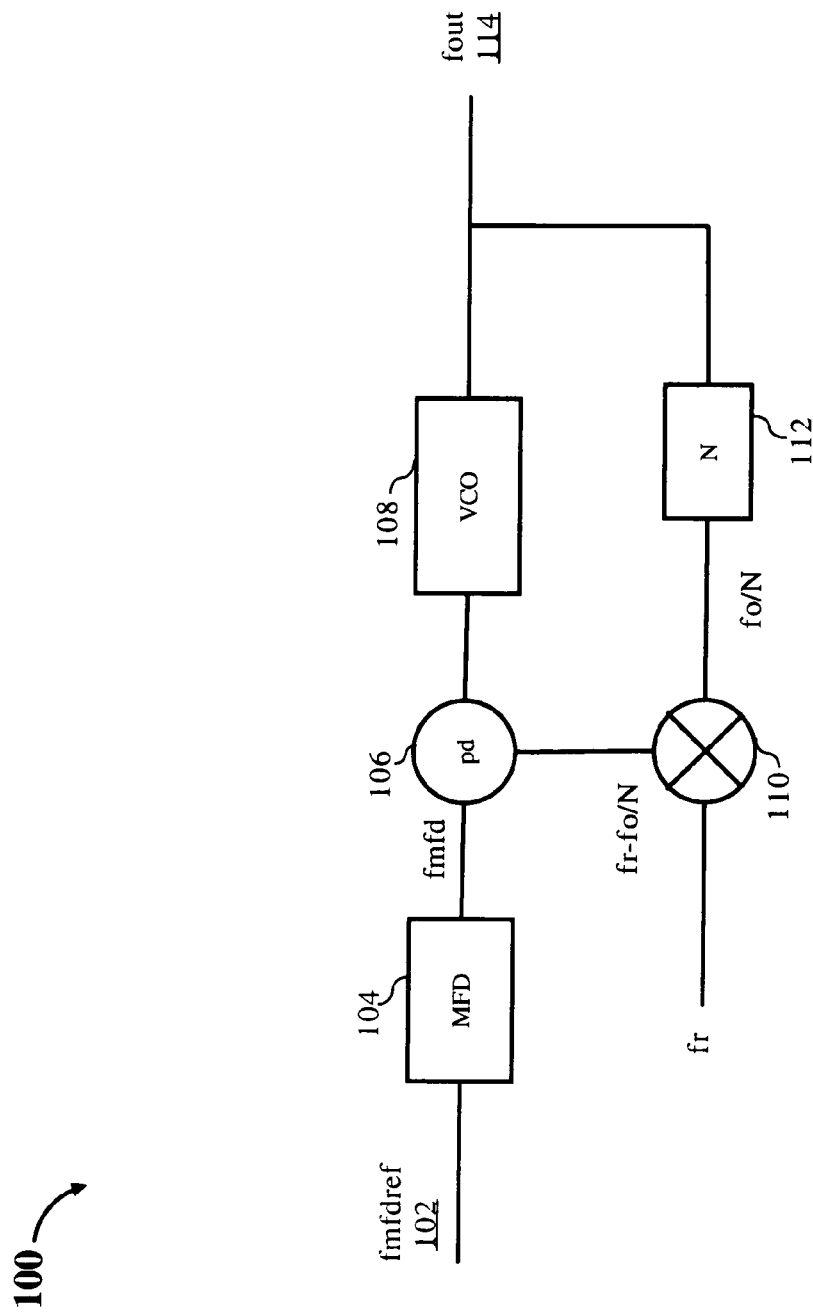
FIG. 1 is a schematic diagram of a prior art frequency synthesizer as described above.
Figure 2:
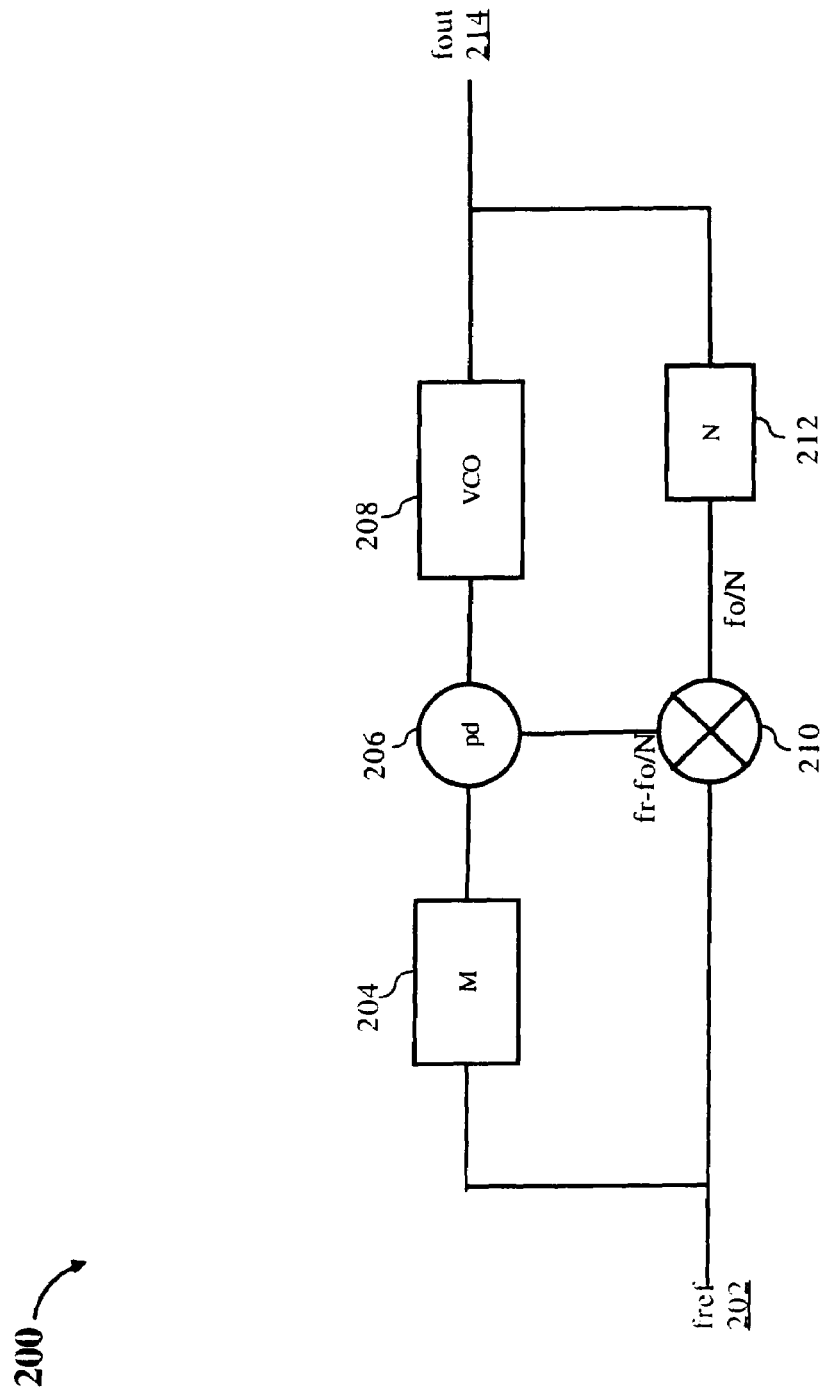
FIG. 2 is a schematic diagram of an additional prior art frequency synthesizer as described above.
Figure 3:
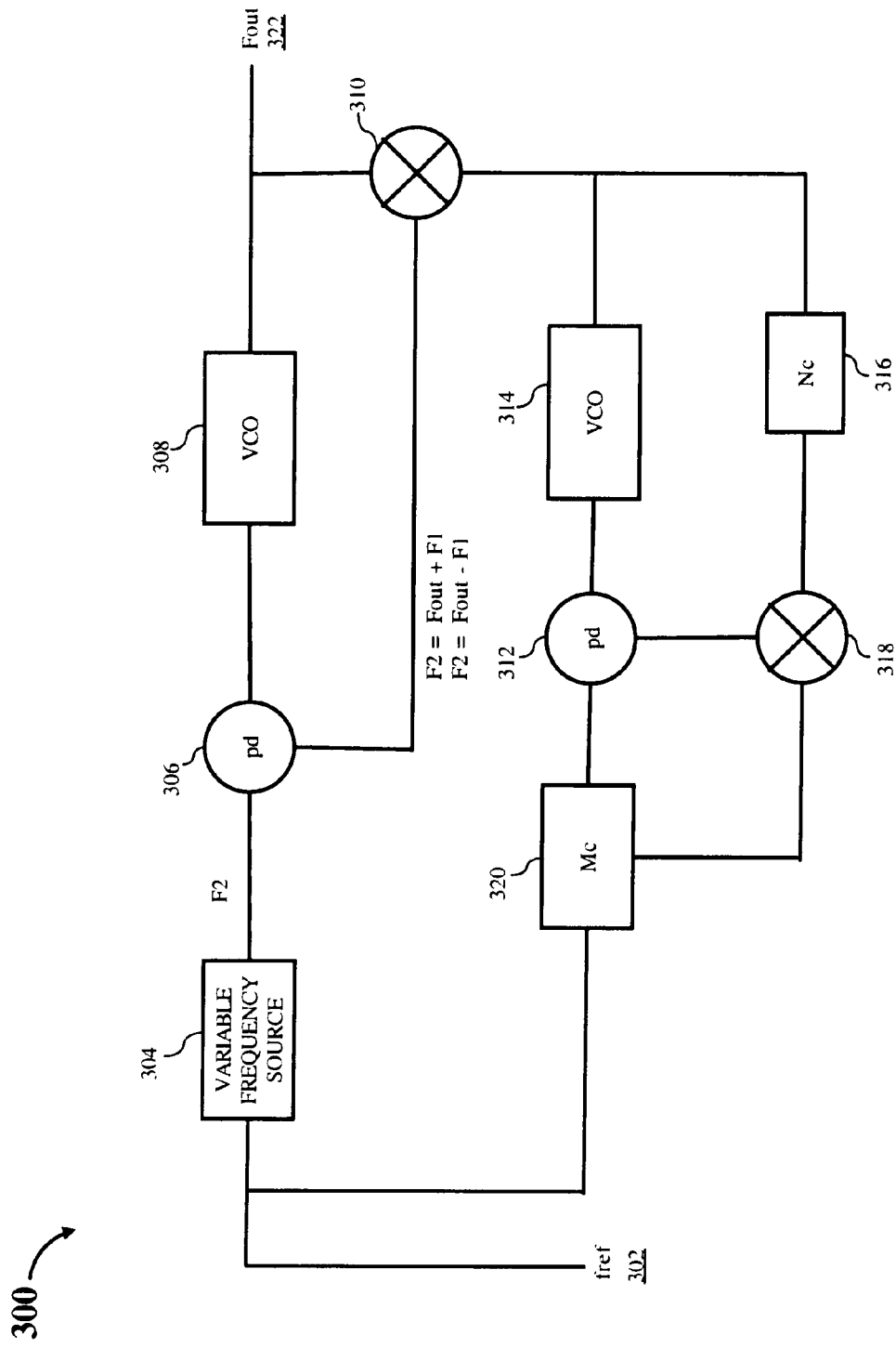
FIG. 3 is a schematic diagram of a frequency synthesizer in accordance with an exemplary embodiment of the present invention.

Referring to FIG. 3, a schematic diagram of a frequency synthesizer 300 in accordance with an exemplary embodiment of the present invention is shown. System 300 may comprise an input reference frequency 302 generated from a large step frequency source, a variable frequency source 304 and a first phase detector 306. Variable frequency source 304 may be a small step variable frequency source. First phase detector 306 may be defined as a frequency mixer or analog multiplier circuit that generates a voltage signal which represents the difference in phase between two signal inputs. First phase detector 306 may be a phase only sensitive detector or a phase frequency detector. Phase only sensitive detector may be suitable for producing an output proportional to the phase difference between two input signals. System 300 may comprise also a first voltage controlled oscillator (VCO) 308 and a first mixer 310. A VCO may be defined as an oscillator whose output frequency is continuously tunable via the application of a control (tuning) voltage. System 300 further comprises a second phase detector 312, a second mixer 318 operably coupled to one input of the second phase detector 312, a second VCO 314 suitable for receiving an output of the second phase detector 312 and at least two frequency divide circuits, a first frequency divide circuit 316 and a second frequency divide circuit 320. The system 300 is suitable for producing a difference mix of the small step variable frequency and the large step frequency. The second VCO 314 and divider 316 may be in a feedback loop of the PLL, and the feedback loop may be suitable for receiving the difference mix of the small step variable frequency and the large step frequency. The system 300 is enabled to have a relatively wide frequency range, and is suitable for effective reduction of noise in the PLL, and producing coherent spurious content in the large step loop.

System 300 utilizes the advantages of a summation in that spurious multiplication is not required. The system 300 modifies the phase detector and feedback divide ratios according to the frequency equation. The frequency equation causes the steps between frequencies to be non-uniform and thus it is more difficult to predict the next frequency step. The frequency steps may be relatively large. Because it is desirable to construct a synthesizer with small step size and wide frequency range, large steps may be added to a frequency source that has a range equal to the large step size and also produces small steps. Large steps may be generated by a course or large step generator. Large step loop may produce non-uniform steps and coherent spurouius content. System 300 is suitable for generating a difference mix of the frequencies, resulting in improved spurious performance.

System 300 forms a feedback loop comprising the second VCO. Feedback loop is suitable for receiving the mix of the large step frequency and the small step frequency in the feedback loop. Feedback loop may comprise non-coherent spurious of the fine step source with respect to the output frequency. Feedback loop acts as a tuned tracked band pass filter to both the large step and fine step sources that are added together.

Advantageously, system 300 utilizes the minimum noise multiplication afforded by the non-uniform large step frequency generation loop. Further, spurious content generated by the small step frequency source may not be required to be multiplied to the output.

System 300 may comprise a feedback loop further comprising a second phase detector 312, a second mixer 318 operably coupled to one input of the second phase detector 312, a second VCO 314 suitable for receiving an output of the second phase detector 312 and the second frequency divide circuit 320 in the feedback loop. The second frequency divide circuit 320 Mc is coupled to the second phase detector 312 to selectively produce one of a plurality of offset frequencies, each of the plurality of offset frequencies being in a frequency range at least equivalent to a frequency range of the large step frequency source. The second mixer 318 has a first input coupled to an output of the first frequency divide circuit 316, an output coupled to an input of the second phase detector 312, and a third input suitable for receiving an input from the second frequency divide circuit 320. System 300 is suitable for providing first and second frequencies, F1 and F2, where $F1=fref*Nc*(1\pm1/Mc)$ and $F2=Fif=Fout\pm F1$. Feedback loop may produce non-coherent spurious content of the fine step frequency source with respect to the output frequency. Feedback loop is suitable for performing as a tuned tracked band pass filter for both the large step source and fine step source frequencies that are added together.

System 300 may further comprise circuitry 316 in the pathway between the second VCO 314 output and the second mixer input 318. In various embodiments of the present invention, this circuitry may be a first and second frequency divide circuits 316, 320 suitable for providing frequency divider functionality. Specifically, first frequency divide circuit 316 may be a divide by Nc circuit, where Nc is an integer. Second divide circuit 320 may be a divide by Mc circuit, where Mc is an integer. Nc and Mc may be equivalent, or may be varied as desired by an operator.

A desired output frequency, such as, for example, twice a current output frequency, may be obtained by adjusting variables such as input frequency fref, divider circuit Mc, and/or divider circuit Nc. A wide range of output frequencies may be calculated by varying the values of the large step frequency source, the small step variable frequency source and the divider circuits Mc and Nc.

System 300 utilizes a small step variable frequency source to provide a frequency having small variable step size. Small step variable frequency source is suitable for generating a range of frequencies equivalent to the frequency range of the large step frequency source. Two signals may be applied to the first phase detector 306, the output of which is a function of the phase difference between the two signals. One of the two signals applied to the first phase detector 306 is the small step variable frequency. The second of the two signals is the output of the first VCO 308, or a signal derived from the output of the first VCO 308. For instance, the output of the first VCO 308 may be amplified by the first mixer 310 and fed to one input of the first phase detector 306. The other input to the first phase detector 306 is originated from the input small step variable frequency 304. A first input terminal of a first mixer 310 is coupled to an output terminal of a first signal source, and a second input terminal of first mixer 310 is coupled to an output terminal of a first VCO 308.

Input frequency 302 and small step variable frequency 304 may be generated utilizing direct digital synthesis. As stated earlier, a course or large step frequency generator may generate the input frequency 302. A fine step module for controlling the small step increments may be utilized as the small step variable frequency generator. Small step increment control may be accomplished using phase-lock loop circuitry with programmable capabilities. Specifically, phase locked loop may be controlled through a precise frequency input from a direct digital synthesizer (DDS). Direct digital synthesis may refer to an electronic method for digitally creating arbitrary waveforms and frequencies from a single, fixed source frequency. A direct digital synthesizer (DDS) is a known circuit which generates through a digital-to-analog signal converter a stepped-wave signal, the shape and frequency of which are respectively formed and controlled by a digital word that is applied through a numerical control input function. A DDS circuit may comprise an electronic controller, a random-access memory, a frequency reference (such as a crystal oscillator), a counter and a digital-to-analogue converter (DAC). However, it is contemplated that input frequency 302 and small step variable frequency 304 may be generated by modulated fractional division, fractional division, or any other appropriate frequency generation architecture. Fractional frequency divider may comprise an integer divider, a summer and a delta-sigma converter. The divider divides the frequency of an incoming signal based upon a fractional control number. The fractional control number is in turn made up of an integer portion and a fractional portion. The delta-sigma converter receives the fractional portion as an input and provides a series of integer value corrections as an output. The integer value corrections are summed with the integer portion in the summer and the result used as the divisor for fractional frequency division.

An additional input to the second phase detector 312 is originated from the stable reference frequency 302, which may be divided down by a divide circuit Mc 320. In an alternative embodiment, reference frequency 302 may be input directly into mixer 318 without division. The second VCO 314 output frequency may also be divided by a divide circuit Nc 316. The divided down frequency may be input to a summing module. To this end, system 300 may comprise a summing module suitable for summing two or more frequencies to produce an output frequency. The resulting frequency may then be amplified and applied to the second phase detector. Also applied to the second phase detector is the signal from the divide by (Nc) circuit in the feedback loop which may be mixed by second mixer 318.

In operation, first mixer 310 receives and mixes signals from the input reference frequency 302 and second VCO 314. As is known in this field, the mixing operation is one which multiplies the input signals thereby producing signal components at frequencies which are the sum and difference of the frequencies of the input signals. There are many circuits, well-known in this field, for implementing mixer functionality. Further, the output of first mixer 310 may be further processed so that, for example, an upper sideband is selected. This processing may be accomplished by means of a bandpass filter or like filter. The filtered output signal of first mixer 310 may be mixed with the output signal of first VCO 308 to produce an output signal Fout.

System 300 may be suitable for combing first and second generated frequencies F1 and F2 as a sum or difference, represented by the equation Fout=F1±F2. For instance, frequency combination may be a difference mix, where F2=Fif=Fout−F1. System provides an output frequency 322 where Fout=F1±F2, or fref*Nc*(1±1/Mc)±F2. More particularly, the circuit architecture of FIG. 3 can achieve a desired frequency step size and a reduction of system noise. This may be accomplished by keeping the multiplication relatively small.

By combining a first signal F1 having a first frequency, with the output of a first frequency having a first frequency step size to produce an intermediate signal which is in turn combined with the output the second VCO 314 having a second frequency step size, an output 322 signal is produced. By varying the output frequencies of the phase locked loop and the feedback loop, the frequency of the output signal is changed by steps of any desired size. In an additional embodiment, a filter, such as a low-pass filter, may be coupled to the output of the first phase detector to properly condition the error signal which controls the first VCO.

Many phase locked loops suffer from the disadvantageous inverse relationship between the step size and the phase noise. Specifically, as the step size decreases, division ratios in the system must increase. Typically, the higher the division ratio, the worse the phase noise within the loop bandwidth close to the center frequency. Another drawback is a slow switching speed from one frequency to another because of the negative-feedback loop dynamics. The large step size loop of the system 300 according to exemplary embodiments of the present invention, however, utilizes the second mixer 318 to minimize the divide ratio and the noise. This is accomplished by the non-uniformity of the course loop steps, and by the course loop steps following the equation given for the large step loop, F1=fref*Nc(1±2/Mc).

Figure 4:
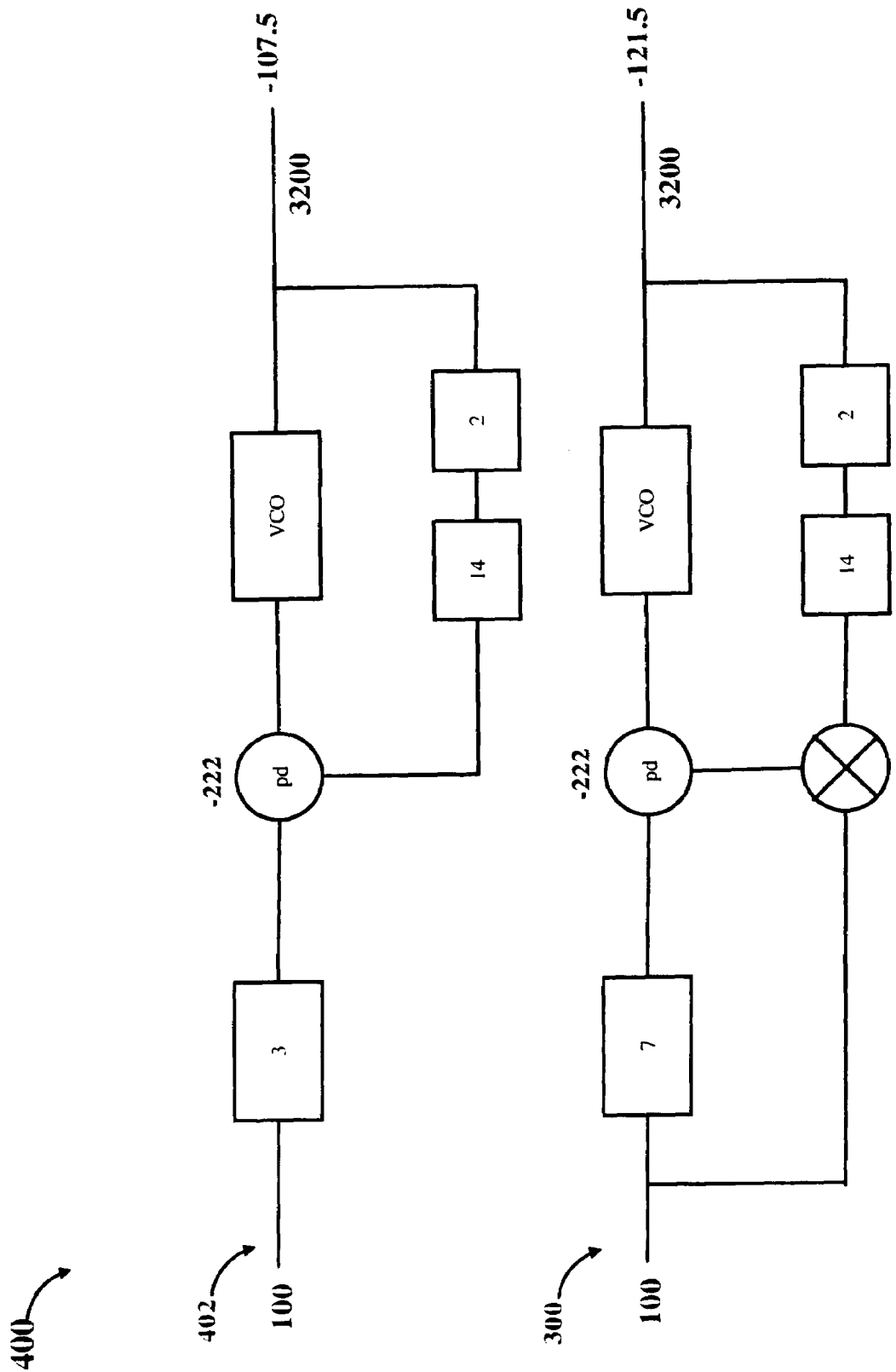
FIG. 4 is a schematic diagram illustrating the phase noise output of a system in accordance with an exemplary embodiment of the present invention.

Referring to FIG. 4, a schematic diagram illustrating the phase noise output of a system 300 in accordance with an exemplary embodiment of the present invention is shown. System 300 may be suitable for providing increased noise reduction when compared to a prior art synthesizer. In FIG. 4, a noise comparison for generating a 3200 MHz frequency from 100 MHz may be accomplished via a prior art synthesizer 402 and a system 300 according to an embodiment of the present invention to illustrate the noise improvement of the scheme. Typically noise is dominated by the phase noise of the phase detector, which may be −222 dBc/Hz in this example. This noise may have other contributors, such as divider noise, reference noise and the like. In the example, only the one source is utilized. The noise is multiplied up, per the standard FM principles, to the output by 96 or 28 times. 96 represents the number due to the limitations of the devices used. With the system 300 according to an embodiment of the present invention, the multiplication is 28, where the same devices are utilized as the phase detector and divider. The same devices were utilized in each case in order to maintain equivalency. The equation utilized to determine the noise is the noise at the phase detector (which in this case is a function of the phase detector frequency (−222 is the noise of the phase detector at 1 Hz) brought up the phase detector frequency in Hz (in these cases 100/3 MHz and 100/7 MHz respectively)) plus the multiplication of the divider (in these cases 96 and 28 respectively.) This results in the following equations:

$$-222+10*\log(100000000/3)+20*\log(96)=-107.1$$

for the prior art synthesizer and $$-222+10*\log(100000000/7)+20*\log(28)=-121.5$$

for the system 300, yielding a noise comparison of −107.1 to −121.5 dBc/Hz, demonstrating the improved noise performance of the system 300.

Figure 5:
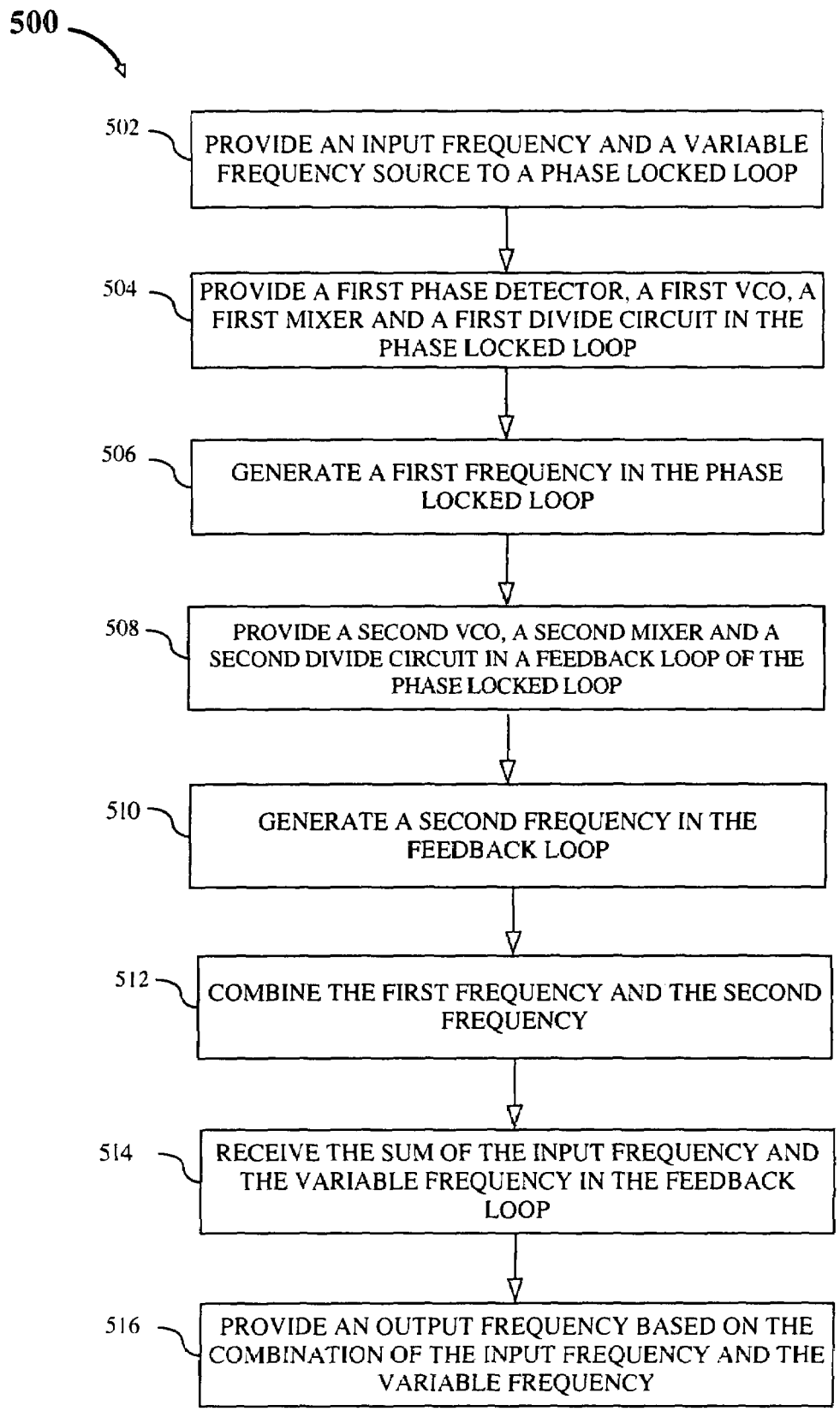
FIG. 5 is a flow diagram illustrating a method of synthesizing a signal in accordance with an exemplary embodiment of the present invention.

Referring to FIG. 5, a flow diagram illustrating a method 500 of synthesizing a signal in accordance with an exemplary embodiment of the present invention. Method 500 comprises providing an input reference frequency and a variable frequency source 502. Variable frequency source may be a small step variable frequency source suitable for generating a fine or small step frequency. Input reference frequency may be a large step frequency generated by a course or large step frequency generator. Method 500 may further comprise providing a first voltage controlled oscillator (VCO), a first phase detector, a first mixer and a first divide circuit forming a phase locked loop 504. Method 500 may generate a first frequency in the phase locked loop 506. First frequency may be a small step frequency suitable for producing non-coherent spurious signals. Method 500 may also comprise providing a feedback loop comprising a second phase detector, a second mixer operably coupled to one input of the second phase detector, a second VCO suitable for receiving an output of the second phase detector and a second divide circuit in the feedback loop 508. Method 500 may generate a second frequency in the feedback loop 510. Feedback loop may be a large step frequency generated by a large step frequency generator. Large step frequency generator may be suitable for producing coherent spurious signals with respect to an output frequency. Method 500 may then combine the first frequency and the second frequency 512, receive the sum of the first and second frequencies in the feedback loop 514 and provide an output frequency based on the combination of the first frequency and the second frequency 516. Phase locked loop may be a small step loop suitable for providing non-coherent spurious content with respect to the output frequency. Feedback loop may be a large step loop suitable for providing coherent spurious content. Method 500 is enabled to provide a frequency synthesizer having a wide frequency range and is suitable for providing effective reduction of noise, and producing coherent spurious content in the large step loop.

It is noted that the term, "coupled", as used herein, includes both direct connection of one or more circuit elements, and the indirect connection between such elements wherein various other circuit elements including but not limited to, wires, conductors, and passive or active devices are included in a pathway between the coupled elements.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is utilized to program a computer to perform the disclosed function and process of the present invention. The computer-readable medium may include, but is not limited to, any type of conventional floppy disk, optical disk, CD-ROM, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A frequency synthesizer comprising:
   an input large step frequency source suitable for generating a large step frequency;
   a variable frequency source suitable for generating a small step frequency;
   a first phase detector;
   a first voltage controlled oscillator;
   a first mixer mixing the large step frequency and the small step frequency to generate a difference mix including non-uniform frequency steps and coherent spurious content;
   a second phase detector;
   a feedback loop, the feedback loop including;
   a second voltage controlled oscillator suitable for receiving an output of the second phase detector; and at least two frequency divide circuits, further including a first frequency divide circuit and a second frequency divide circuit coupled to the second phase detector to selectively produce one of a plurality of offset frequencies;

a second mixer including a first input operably coupled to an input of the second phase detector, a second input coupled to an output of the first frequency divide circuit, and a third input suitable for receiving an input from the second frequency divide circuit; and wherein said input large step frequency and said small step frequency are suitable for combining to form an output frequency, second voltage controlled oscillator is in said feedback loop and said feedback loop is suitable for receiving the difference mix of the small step variable frequency and the large step frequency.

2. The frequency synthesizer of claim 1, wherein said variable frequency source is a small step variable frequency source.

3. The frequency synthesizer of claim 2, wherein said small step variable frequency source is generated by one of direct digital synthesis, frequency division or modulated frequency division.

4. The frequency synthesizer of claim 1, wherein said output frequency is a difference between or a sum of said large step frequency and said small step frequency.

5. The frequency synthesizer of claim 2, wherein said small step variable frequency source comprises a range equivalent to a range of said input large step frequency source.

6. The frequency synthesizer of claim 5, wherein said feedback loop is suitable for providing tuned tracked band pass filtering for said input large step frequency and said small step variable frequency.

7. A frequency synthesizer comprising:
an input large step reference frequency;
a variable frequency source suitable for generating a variably frequency;
a first voltage controlled oscillator comprising a control terminal;
a first phase detector with a first input for receiving a first signal, a second input for receiving a second signal and an output for outputting a function of the phase difference between the two signals, said first input of said first phase detector being coupled to said variable frequency source, said output of said detector being coupled to said control terminal of said voltage controlled oscillator;
a second phase detector;
a second voltage controlled oscillator;
a second mixer; and
at least two frequency divider circuits in the pathway between an output of the second voltage controlled oscillator and the second mixer input,
wherein said input large step frequency and said variable frequency are suitable for combining to form a mixed frequency, second voltage controlled oscillator is in a feedback loop, and said feedback loop is suitable for receiving the difference mix of the input large step reference frequency and the variable frequency and outputting a frequency obtained by adjusting at least one of the input large step reference frequency, or at least one of the at least two frequency divider circuits.

8. The frequency synthesizer of claim 7, wherein said variable frequency source is a small step variable frequency source suitable for generating a small step frequency.

9. The frequency synthesizer of claim 8, wherein said small step variable frequency is generated by said variable frequency source by one of direct digital synthesis, frequency division or modulated frequency division.

10. The frequency synthesizer of claim 7, wherein said feedback loop is suitable for providing tuned tracked band pass filtering for said input large step frequency and said small step variable frequency.

11. The frequency synthesizer of claim 8, wherein said input large step reference frequency is generated via a large step frequency source comprising a large step frequency source range.

12. The frequency synthesizer of claim 11, wherein said variable frequency source is comprises a range equivalent to a range of said input large step frequency source.

13. The frequency synthesizer of claim 11, wherein said output frequency is a difference between or a sum of said input large step reference frequency and said small step variable frequency.

14. The frequency synthesizer of claim 7, wherein said feedback loop is suitable for providing tuned tracked band pass filtering for said input large step frequency and said small step variable frequency.

15. A method of synthesizing a signal comprising:
providing an input large step reference frequency and a variable small step frequency source to a phase locked loop;
providing a first phase detector, a first voltage controlled oscillator operably coupled to said phase detector, a first mixer suitable for receiving an input from said first voltage controlled oscillator and a first divide circuit in said phase locked loop;
generating a first frequency in said phase locked loop
providing a second voltage controlled oscillator, a second mixer and a second divide circuit in a feedback loop of said phase locked loop, the second frequency divide circuit coupled to the second phase detector to selectively produce one of a plurality of offset frequencies, each of the plurality of offset frequencies being in a frequency range at least equivalent to a frequency range of the large step frequency reference frequency;
generating a second frequency in said feedback loop
receiving a combination of said first frequency and said second frequency;
providing an output frequency based on said combination of said first frequency and said second frequency.

16. The method of claim 15, wherein said variable frequency source is a small step variable frequency source.

17. The method of claim 16, wherein said small step variable frequency source is suitable for generating a small step variable frequency by one of direct digital synthesis, frequency division or modulated frequency division.

18. The method of claim 17, wherein said input frequency is a large step frequency generated by a large step frequency source.

19. The method of claim 18, wherein said small step variable frequency source comprises a range equivalent to a range of said large step frequency source.

20. The method of claim 15, wherein said feedback loop is suitable for providing tuned tracked band pass filtering for said input large step frequency and said small step variable frequency.

* * * * *